(12) United States Patent
Arsovski et al.

(10) Patent No.: US 7,859,878 B2
(45) Date of Patent: *Dec. 28, 2010

(54) DESIGN STRUCTURE FOR IMPLEMENTING MATRIX-BASED SEARCH CAPABILITY IN CONTENT ADDRESSABLE MEMORY DEVICES

(75) Inventors: Igor Arsovski, Williston, VT (US); Kerry Bernstein, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 275 days.

This patent is subject to a terminal disclaimer.

(21) Appl. No.: 12/110,375

(22) Filed: Apr. 28, 2008

(65) Prior Publication Data

US 2009/0141529 A1 Jun. 4, 2009

Related U.S. Application Data

(63) Continuation-in-part of application No. 11/949,063, filed on Dec. 3, 2007, now Pat. No. 7,848,128.

(51) Int. Cl.
*G11C 15/00* (2006.01)

(52) U.S. Cl. ............... 365/49.17; 365/49.11; 365/168

(58) Field of Classification Search ............... 365/48.1, 365/49.11, 49.17, 154, 156, 168, 189.04, 365/49.1
See application file for complete search history.

(56) References Cited

U.S. PATENT DOCUMENTS

| | | | | |
|---|---|---|---|---|
| 3,402,398 A | * | 9/1968 | Koerner et al. | 365/49.17 |
| 3,483,528 A | * | 12/1969 | Koerner | 365/49.17 |
| 5,388,066 A | * | 2/1995 | Hamamoto et al. | 365/49.17 |
| 5,831,896 A | | 11/1998 | Lattimore et al. | |
| 5,859,791 A | | 1/1999 | Schultz et al. | |
| 5,893,137 A | | 4/1999 | Parks et al. | |
| 5,995,401 A | | 11/1999 | Schultz et al. | |
| 6,046,923 A | | 4/2000 | Evans | |
| 6,392,910 B1 | | 5/2002 | Podaima et al. | |
| 6,487,101 B1 | | 11/2002 | Ashbrook et al. | |
| 6,618,279 B2 | | 9/2003 | Towler et al. | |
| 6,618,281 B1 | | 9/2003 | Gordon | |
| 6,781,857 B1 | | 8/2004 | Lien et al. | |
| 7,054,994 B2 | | 5/2006 | Kastoriano et al. | |
| 7,057,913 B2 | | 6/2006 | Hsu et al. | |
| 7,206,251 B1 | | 4/2007 | Yu | |

(Continued)

OTHER PUBLICATIONS

F. Shafai et al., "Fully Parallel 30-MHz, 2.5-Mb CAM;" IEEE Journal of Solid-State Circuits, vol. 33, No. 11 Nov. 1998, pp. 1690-1696.

(Continued)

*Primary Examiner*—Gene N. Auduong
(74) *Attorney, Agent, or Firm*—Cantor Colburn LLP; Michael LeStrange

(57) ABSTRACT

A design structure embodied in a machine readable medium used in a design process includes a content addressable memory (CAM) device having an array of memory cells arranged in rows in a word line direction and columns arranged in a bit line direction, and compare circuitry configured to compare data presented to the array with data stored in each row and column of the array, and simultaneously indicate match results on each row and column of the array, thereby resulting in a two-dimensional, matrix-based data comparison operation.

13 Claims, 8 Drawing Sheets

U.S. PATENT DOCUMENTS

| | | | |
|---|---|---|---|
| 7,447,812 | B1 | 11/2008 | Mo et al. |
| 7,515,449 | B2 * | 4/2009 | Arsovski et al. ............ 365/49.1 |
| 7,688,611 | B2 * | 3/2010 | Arsovski et al. ............ 365/49.1 |
| 2002/0191605 | A1 | 12/2002 | Lunteren et al. |
| 2006/0190679 | A1 | 8/2006 | Albrecht et al. |
| 2006/0203529 | A1 | 9/2006 | Radke |
| 2009/0141527 | A1 * | 6/2009 | Arsovski et al. ......... 365/49.17 |
| 2009/0141528 | A1 * | 6/2009 | Arsovski et al. ......... 365/49.17 |

OTHER PUBLICATIONS

U.S. Appl. No. 11/532,233, Filed Sep. 12, 2006 for CAM Asynchronouse Search-Line Switching.

* cited by examiner

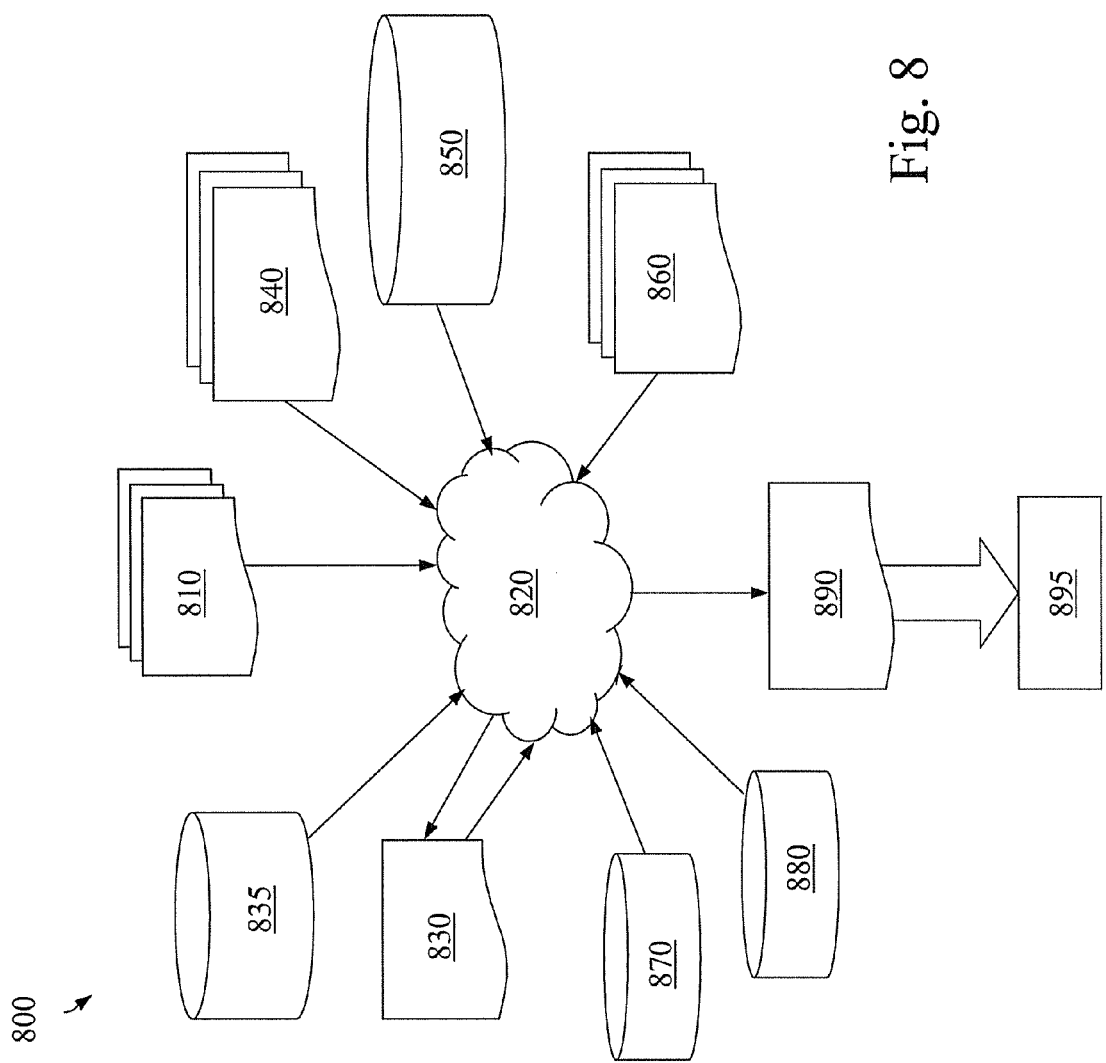

DESIGN STRUCTURE FOR IMPLEMENTING MATRIX-BASED SEARCH CAPABILITY IN CONTENT ADDRESSABLE MEMORY DEVICES

CROSS-REFERENCE TO RELATED APPLICATIONS

This non-provisional U.S. patent application is a continuation in part of pending U.S. patent application Ser. No. 11/949,063, which was filed Dec. 3, 2007, now U.S. Pat. No. 7,848,128, and is assigned to the present assignee.

BACKGROUND

The present invention relates generally to integrated circuit memory devices and, more particularly, to a design structure for implementing matrix-based search capability in content addressable memory (CAM) devices.

A content addressable memory (CAM) is a storage device in which storage locations can be identified by both their location or address through a read operation, as well as by data contents through a search operation. An access by content starts by presenting a search argument to the CAM, wherein a location that matches the argument asserts a corresponding match line. One use for such a memory is in dynamically translating logical addresses to physical addresses in a virtual memory system. In this case, the logical address is the search argument and the physical address is produced as a result of the dynamic match line selecting the physical address from a storage location in a random access memory (RAM). Accordingly, exemplary CAM search operations are used in applications such as address-lookup in network ICs, translation lookaside buffers (TLB) in processor caches, pattern recognition, data compression, etc. CAMs are also frequently used for address-look-up and translation in Internet routers and switches.

A CAM typically includes an array of CAM cells arranged in rows and columns, where each row of the CAM array corresponds to a stored word. The CAM cells in a given row couple to a word line and a match line associated with the row. The word line connects to a control circuit that can either select the row for a read/write operation or bias the word line for a search. The match line carries a signal that, during a search, indicates whether the word stored in the row matches an applied input search word. Each column of the conventional CAM array corresponds to the same bit position in all of the CAM words, while the CAM cells in a particular column are coupled to a pair of bit lines and a pair of search-lines associated with the column. A search data is applied to each pair of search lines, which have a pair of complementary binary signals or unique ternary signals thereon that represent a bit of an input value. Each CAM cell changes the voltage on the associated match line if the CAM cell stores a bit that does not match the bit represented on the attached search lines. If the voltage on a match line remains unchanged during a search, the word stored in that row of CAM cells matches the input word.

As will thus be appreciated, conventional CAM devices are only capable of searching words of data that are stored in one dimension (1D), comparing, for example, the search data against all words that run along the word line (WL) direction. In this instance, such searching capability does not also extend to the data bits along a common bit line (BL) in conventional CAM. Regardless of the particular direction (row versus column) of a 1D CAM search, a conventional CAM device is not capable of simultaneously comparing an entire matrix of search data with an entire matrix of stored data. Accordingly, it would be desirable to be able to implement CAM structures that provide the capability of full data matrix searching.

SUMMARY

The foregoing discussed drawbacks and deficiencies of the prior art are overcome or alleviated by a design structure embodied in a machine readable medium used in a design process, the design structure including an array of memory cells arranged in rows in a word line direction and columns arranged in a bit line direction, and compare circuitry configured to compare data presented to the array with data stored in each row and column of the array, and simultaneously indicate match results on each row and column of the array, thereby resulting in a two-dimensional, matrix-based data comparison operation.

BRIEF DESCRIPTION OF THE DRAWINGS

Referring to the exemplary drawings wherein like elements are numbered alike in the several Figures:

FIG. 8 is a flow diagram of an exemplary design process used in semiconductor design, manufacturing, and/or test.

DETAILED DESCRIPTION

Disclosed herein is a novel design structure embodied in a machine readable medium used in a design process for implementing enhanced CAM search capability in integrated circuit devices. Briefly stated, a 20-transistor (20T) ternary CAM (TCAM) cell is introduced which, in one configured embodiment, facilitates matrix-based searching simultaneously along both row (word line) and column (bit line) directions. By facilitating searches along both row and column directions of a memory array, a CAM device thus configured is well suited for applications such as, for example, image detection, pattern-recognition, data compression and other applications that perform operations on large mathematical matrices. In another embodiment, a 14T binary CAM cell may be configured in a manner similar to the TCAM structure to allow for matrix-based CAM searching. In addition, Both the TCAM and binary CAM embodiments may be configured with NOR or NAND type control logic, as described in further detail herein.

Figure 1:
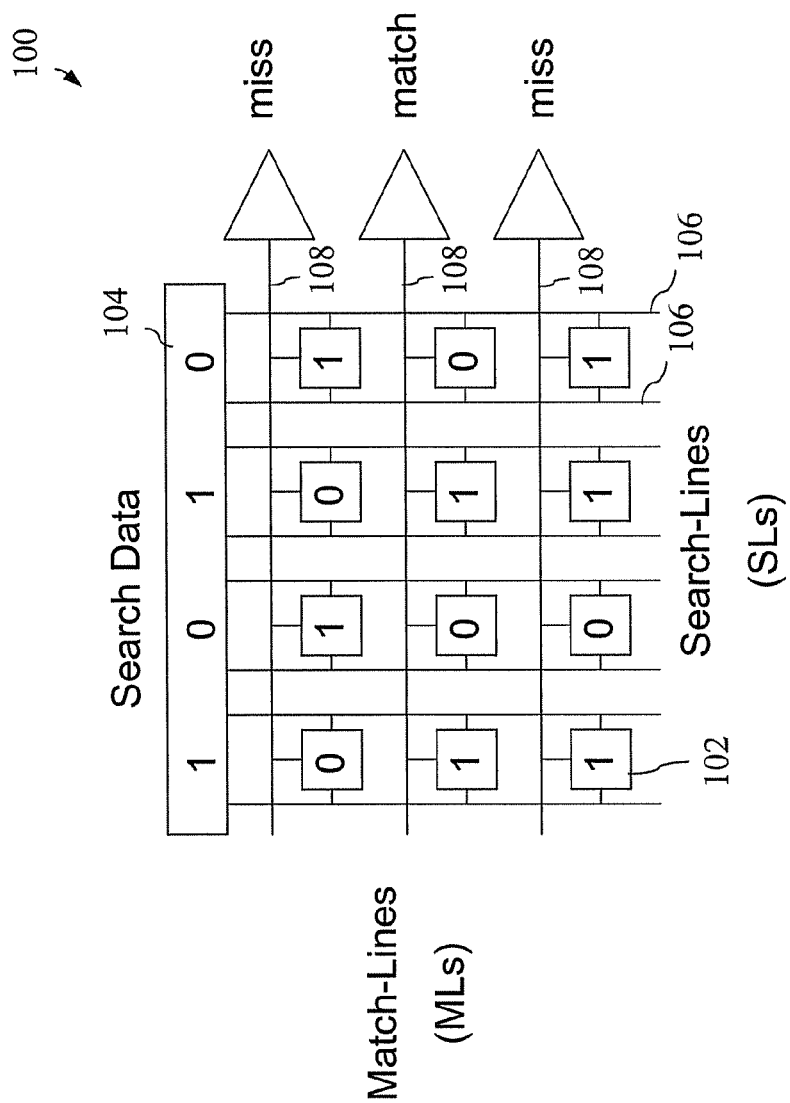
FIG. 1 is a schematic diagram illustrating the operation of a conventional CAM array.

Referring initially to FIG. 1, there is shown a schematic diagram illustrating the operation of a conventional CAM array 100. In the example depicted, the CAM array includes a plurality of individual cells 102, arranged into rows (in a word line direction) and columns (in a bit line direction). Although a simple 3×4 array is depicted for illustrative purposes, it will be appreciated that an actual CAM array may have hundreds or thousands of bits in the row and column directions. As opposed to RAM devices where a specific address (word line) is presented and data is read from/written to the that address, the conventional CAM 100 operates by broadcasting search data 104 to the array through a pair of search lines 106 associated with each column, and determining which row(s) has data matching the broadcasted search data. In order to detect and indicate the results of the search, each row of the array includes a corresponding match line 108. The match lines 108 are precharged to a logical high value such that if any one or more data bits within that row that does not match the corresponding bit in the search data 104, then the match line is discharged to a logical low value, signifying a mismatch condition. Conversely, if each data bit within that row matches the corresponding bit in the search data 104, then the match line is not discharged, signifying a match condition.

In the example shown in FIG. 1, it will be seen that the search data '1010' exactly matches the data in the second row of the array, thus that match line remains charged high so as to reflect a match condition. On the other hand, the first and third rows of the array both have at least one bit that does not match the '1010' search data, thus those match lines are discharged to reflect a mismatch condition. As indicated above, however, although the conventional CAM array 100 is capable of comparing a search word with every other stored word in the array along the word line (row) direction, the same type of data searching and pattern matching along the column direction is not possible as the search lines run parallel to the bit lines associated with the cells. As such, it follows that the conventional CAM array 100 is also incapable of searching and comparing entire matrices of data.

Figure 2:
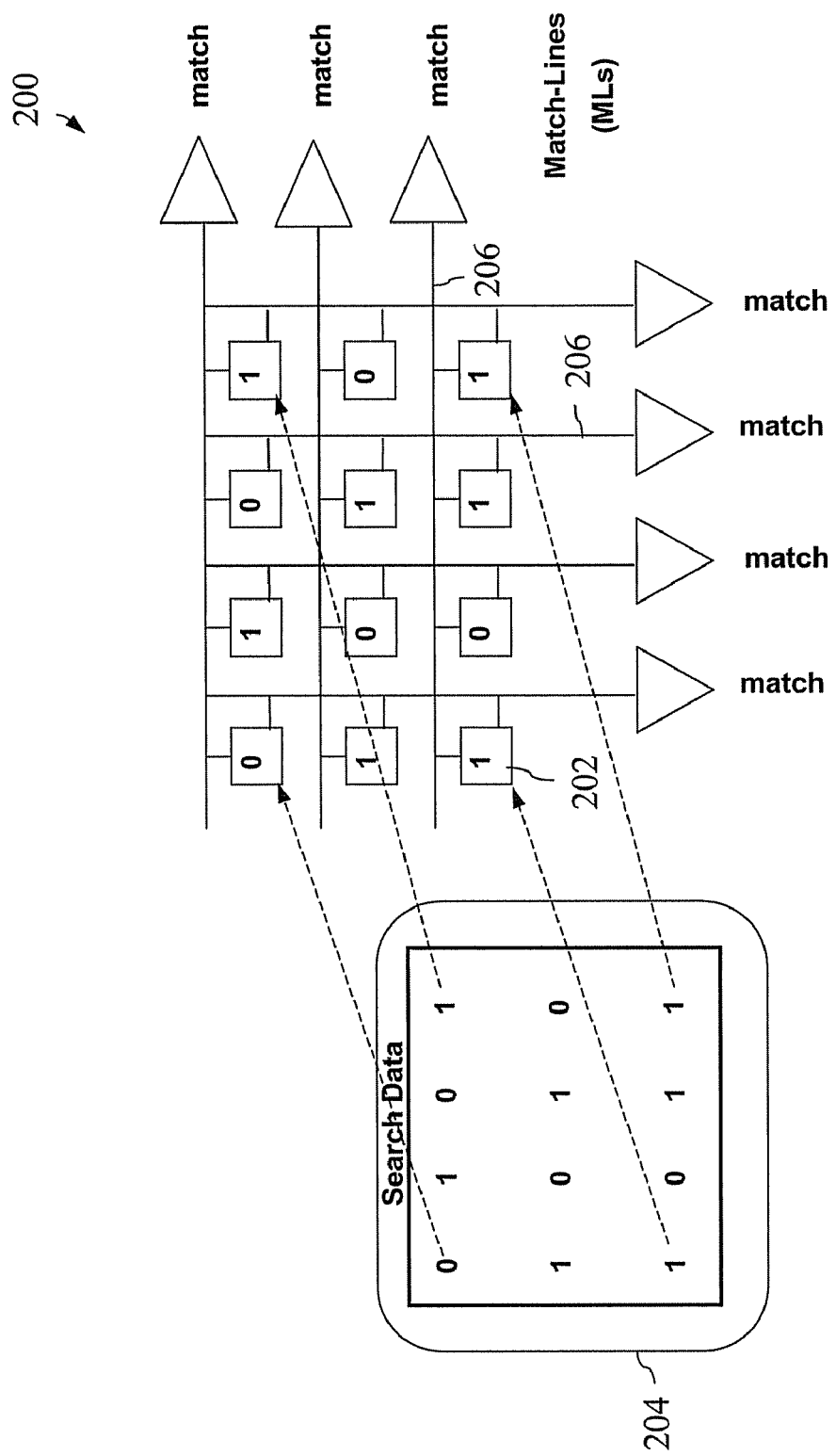
FIG. 2 is a schematic diagram illustrating the operation of a CAM array having matrix-based search capability, in accordance with an embodiment of the invention.

Accordingly, FIG. 2 is a schematic diagram illustrating the operation of a CAM array 200 having matrix-based search capability, in accordance with an embodiment of the invention. As will be seen, the cells 202 of the array 200 are configured such that matrix-based search data 204 (i.e., a two-dimensional data set) may be simultaneously presented to the entire array of cells (in both word line and column line directions), with the match results thereof indicated on match lines 206 disposed in both row and column directions. For purposes of clarity, the search lines used to present the matrix search data 204 are not illustrated in the high-level schematic of FIG. 2.

Figure 3:
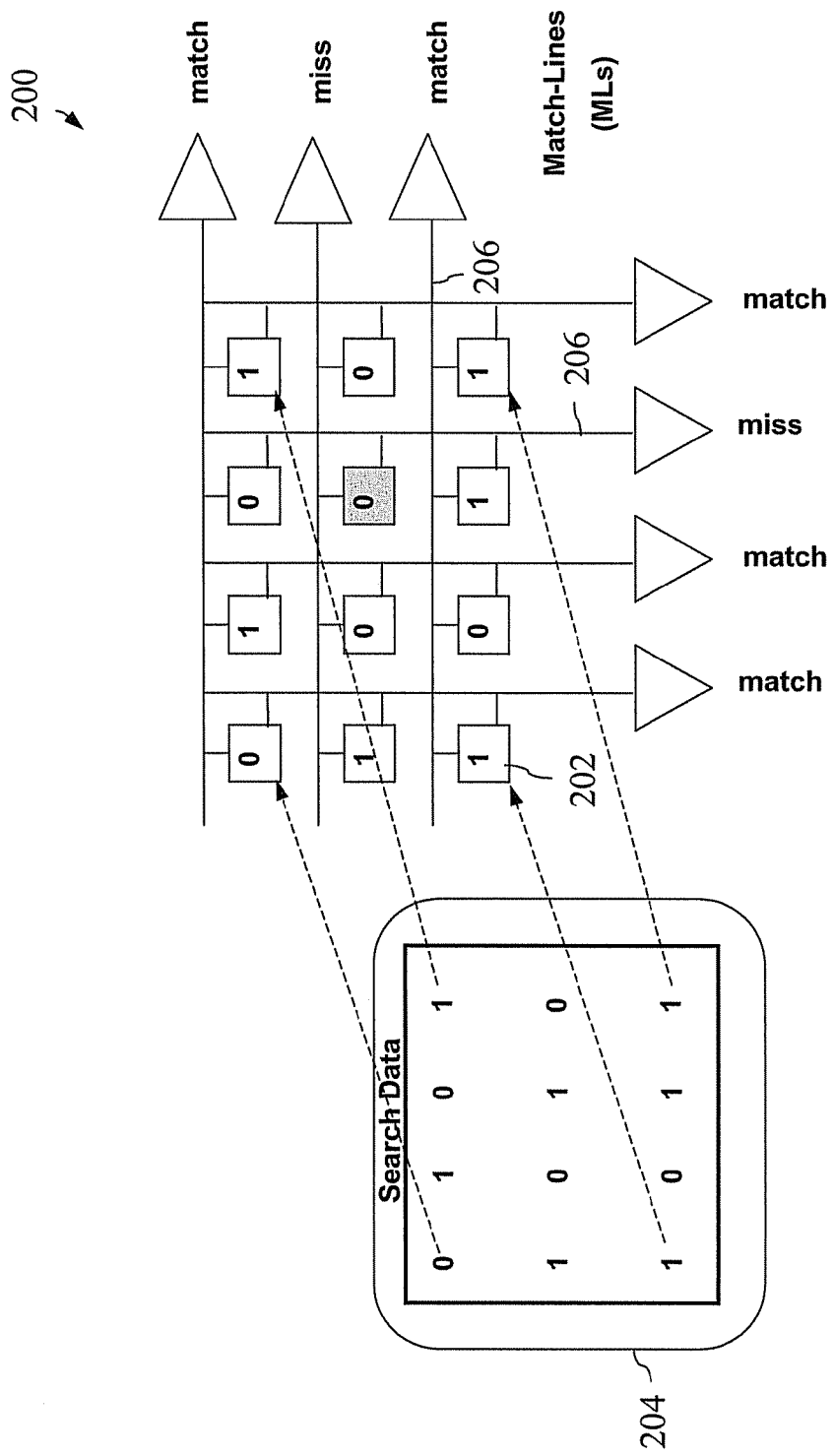
FIG. 3 illustrates the CAM array of FIG. 2 during a matrix mismatch condition.

For any given array 200 formed on a chip, the matrix-based search data 204 may be presented to each individual cell 202 on inter-chip search lines from an adjacent chiplet (e.g., located above or below the memory chip), thereby allowing a search of entire data matrices in parallel. In the event of a full matrix match, all match lines (row and column oriented) go high as shown in FIG. 2. On the other hand, when the matrix mismatches by at least one cell, as shown in the shaded region of FIG. 3, the XY coordinates of the mismatch may be determined by examining the row and column search results. Although a large bandwidth would be associated with the matrix-based search CAM 200, this is not necessarily impractical for three-dimensional or multiple chip devices.

Figure 4:
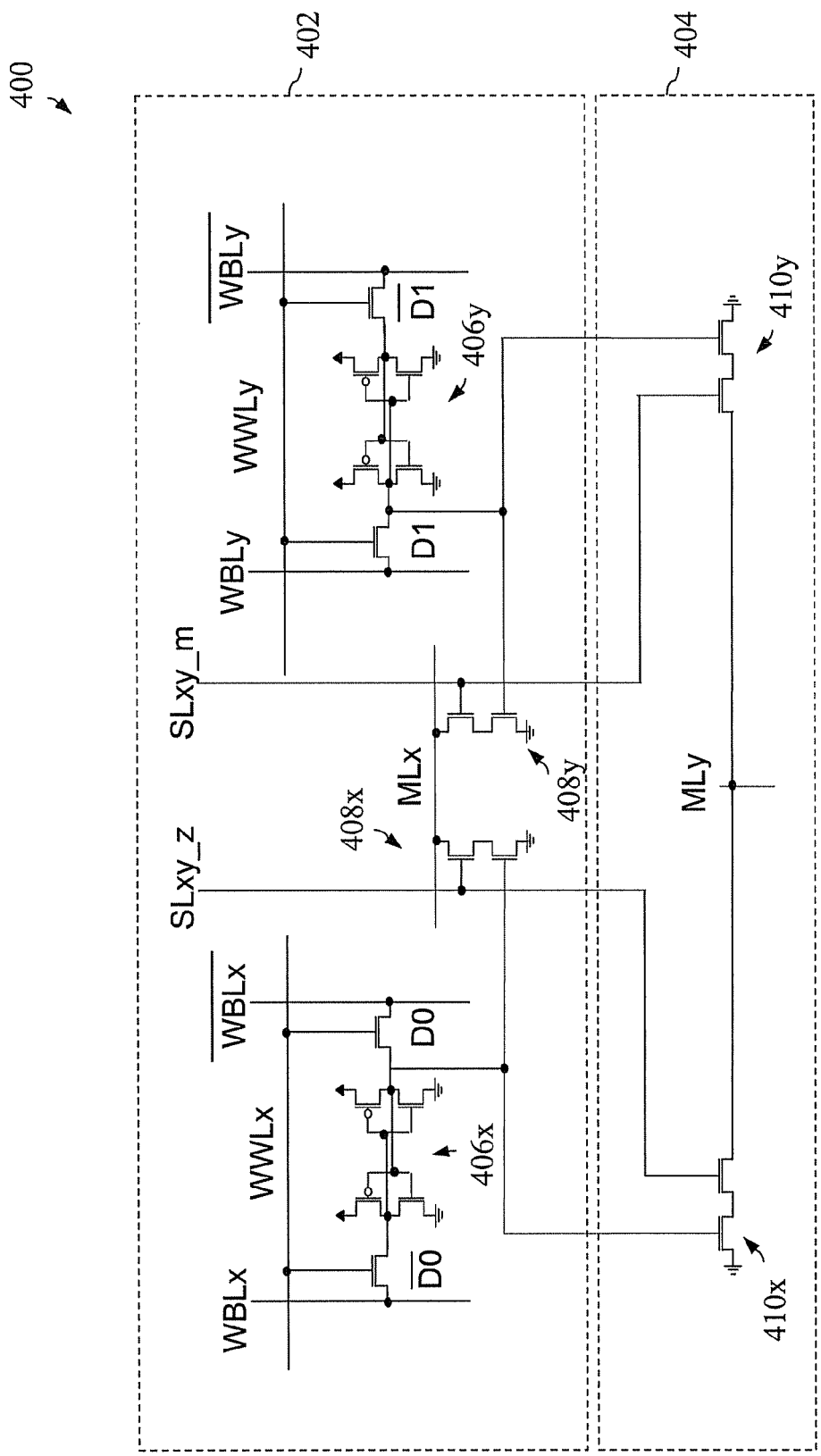
FIG. 4 is a schematic diagram of a 20-transistor (20T), NOR-type ternary CAM (TCAM) cell that may be used to implement the functionality of the matrix-based search CAM array of FIG. 2, in accordance with a further embodiment of the invention.

Referring now to FIG. 4, there is shown a schematic diagram of a 20-transistor (20T) ternary CAM (TCAM) cell 400 that may be used to implement the functionality of the matrix-based CAM array 200 of FIG. 2, in accordance with a further embodiment of the invention. A first portion 402 of the TCAM cell 400 includes devices that facilitate writing to the cell, reading the cell (in a non-search mode), and performing a ternary search in the row or word line direction of an array employing the cell 400. In addition, a second portion 404 of the TCAM cell 400 includes devices that facilitate simultaneously performing a ternary search in the column or bit line direction of an array employing the cell 400, thereby resulting in a matrix-based search, as described in further detail hereinafter.

More specifically, the first portion 402 of the TCAM cell 400 includes a pair of 6T SRAM storage devices, 406$x$, 406$y$. In a binary CAM cell, only one SRAM device would be needed to store either a logical 0 or 1 therein. However, since a TCAM also provides for a "don't care" or "X" state, a second storage bit is used in the cell. Each 6T SRAM storage device 406$x$, 406$y$, in turn includes a 4T latch device comprising a pair of cross-coupled CMOS inverters, and a pair of access transistors. The access transistors are activated by charging the associated write word line for the SRAM latches (i.e., WWLx, WWLy), which couples the true and complement nodes (D0, D0 bar, D1, D1 bar) of the latches to the respective write bit lines (i.e., WBLx, WBLx bar, WBLy, WBLy bar). In the illustrated embodiment, data is written to (and optionally read from) the cells through these word and bit lines.

In order to accomplish row-oriented data searching in the TCAM cell 400, the first portion 402 of the TCAM cell 400 also includes match line circuitry, depicted as search lines SLxy_z and SLxy_m, row-oriented match line MLx, and NFET stacks 408$x$, 408$y$ connected in series between MLx and ground. In an exemplary embodiment, the search lines are disposed in a "z direction" with respect to the planar row/column orientation of the cell (e.g., from a chiplet that is above or below the array), contacting one cell only such that SLxy_z and SLxy_m represent the pair of search lines that contact the cell located at the x-th row and y-th column. The gate terminal of the bottom NFET in NFET stack 408$x$ is coupled to the true data node D0 of the SRAM storage device 406$x$, while the gate terminal of the bottom NFET in NFET stack 408$y$ is coupled to the true data node D1 of the SRAM storage device 406$y$. The gate terminals of the top NFET in NFET stacks 408$x$, 408$y$, are respectively coupled to the search lines, SLxy_z and SLxy$_m$.

Similarly, in order to accomplish column-oriented data searching in the TCAM cell 400, the second portion 404 of the TCAM cell 400 includes an additional four transistors, comprising NFET stacks 410$x$ and 410$y$ connected in series between a column-oriented match line MLy and ground. The gate terminal of the bottom NFET in NFET stack 410$x$ is coupled to the true data node D0 of the SRAM storage device 406$x$, while the gate terminal of the bottom NFET in NFET stack 410$y$ is coupled to the true data node D1 of the SRAM storage device 406$y$. The gate terminals of the top NFET in NFET stacks 410$x$, 410$y$, are respectively coupled to the search lines, SLxy_z and SLxy_m. Alternatively, it will be appreciated that the order of the transistors (top and bottom) of each of the NFET stacks can be reversed.

Accordingly, by presenting search data to the individual TCAM cell 400 and having the search results simultaneously reflected on both a row-oriented match line (MLx) and a column-oriented match line (MLy), the cell effectively participates in a matrix-based search.

Figure 5:
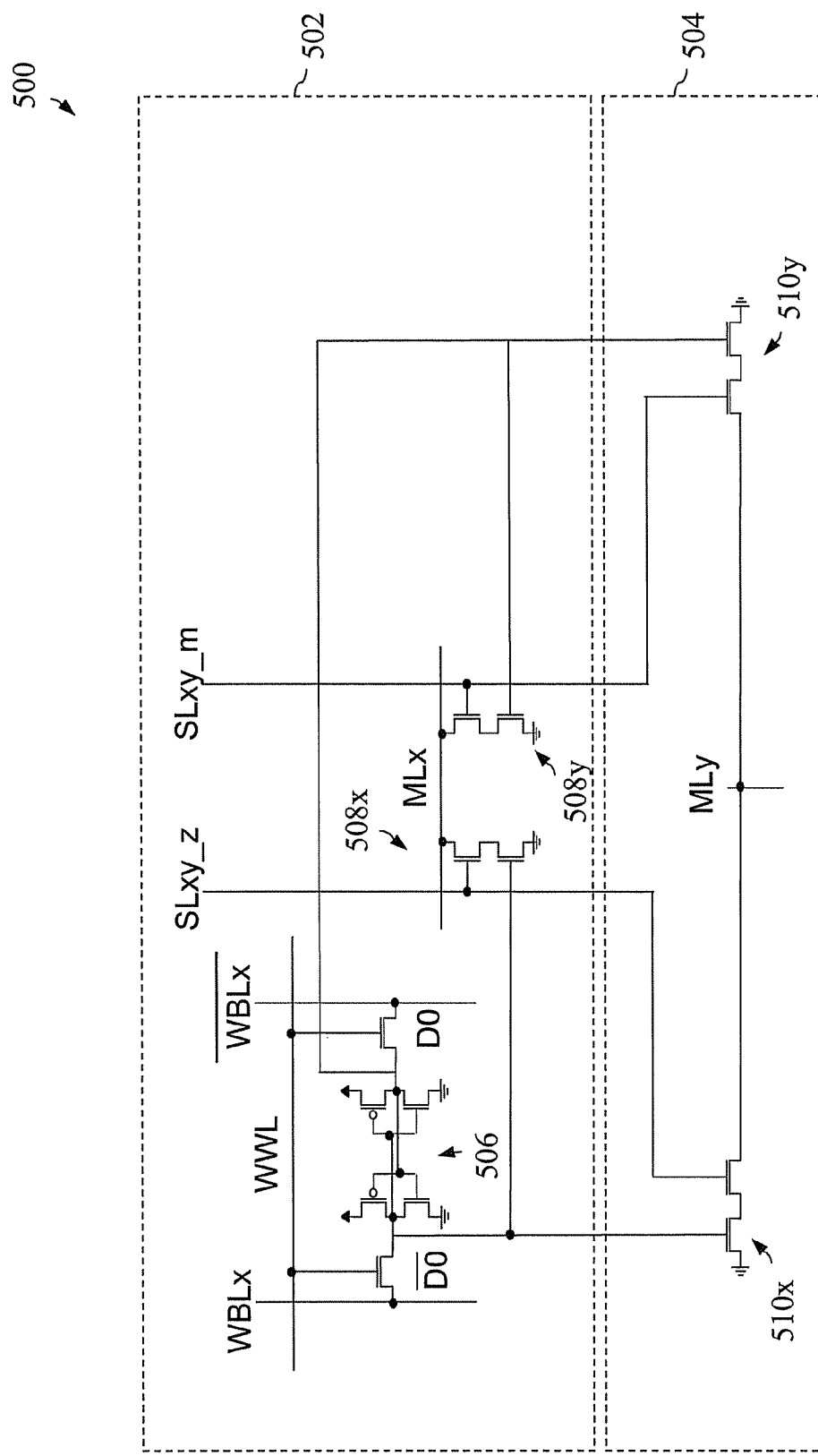
FIG. 5 is a schematic diagram of a 14T, binary version of the NOR-type TCAM cell in FIG. 4.

By way of comparison, FIG. 5 is a schematic diagram of a 14T CAM cell 500, which is binary version of the TCAM cell 400 in FIG. 4. In lieu of a pair of SRAM devices, the binary CAM cell 500 includes a single SRAM device 506. The bottom NFETs of stacks 508x, 508y of the row-oriented match line circuitry are coupled to opposing nodes D0 bar, D0 of the SRAM device, as are the bottom NFETs of stacks 510x, 510y of the column-oriented match line circuitry.

Both the TCAM cell 400 of FIG. 4 and the binary CAM version of the cell 500 in FIG. 5 utilize NOR-type logic with respect to the compare/match functionality of the circuit. However, it will readily be appreciated that other types of match circuit logic could also be employed for the present matrix-based search approach. For example, FIG. 6 is a schematic diagram of a 20T, NAND-type TCAM cell 600 that may be used to implement the functionality of the matrix-based CAM array of FIG. 2, in accordance with a further embodiment of the invention.

Figure 6:
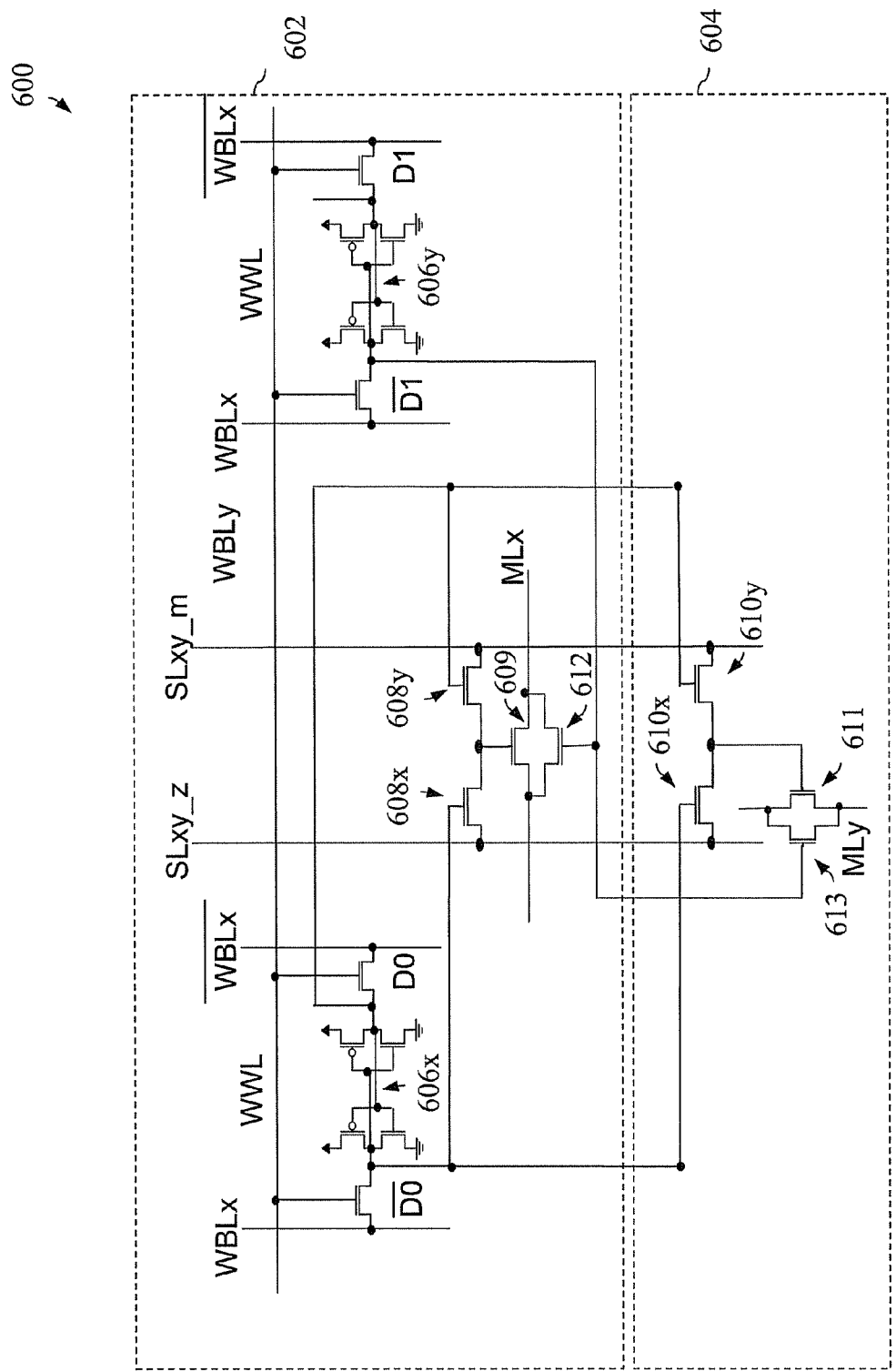
FIG. 6 is a schematic diagram of a 20T, NAND-type TCAM cell that may be used to implement the functionality of the matrix-based search CAM array of FIG. 2, in accordance with a further embodiment of the invention.

Similar to the embodiment of FIG. 4, the TCAM cell 600 of FIG. 6 includes a pair of SRAM storage devices 606x, 606y in the first portion 602 thereof. In contrast to the NOR-type logic, the cell 600 includes a first pair of NFET pass gate devices 608x, 608y coupled across the sense lines SLxy_z, SLxy_m. The gate terminal of pass gate 608x is activated by the complementary data node D0 bar of SRAM cell 606x, while the gate terminal of pass gate 608y is activated by the true data node D0 of SRAM cell 606x. An NFET 609 is connected in series with the row-oriented match line MLx, and has the gate terminal thereof connected between the pass gate devices 608x, 608y.

As further shown in FIG. 6, the second portion 604 of the NAND-type TCAM cell 600 includes a second pair of NFET pass gate devices 610x, 610y also coupled across the sense lines SLxy_z, SLxy_m. The gate terminal of pass gate 610x is activated by the complementary data node D0 bar of SRAM cell 606x, while the gate terminal of pass gate 610y is activated by the true data node D0 of SRAM cell 606x. An NFET 611 is connected in series with the column-oriented match line MLy, and has the gate terminal thereof connected between the pass gate devices 610x, 610y.

In the event of a data match of the data presented on sense lines SLxy_z, SLxy_m, NFET 609 is activated so as to pass a control signal along row-oriented MLx. Conversely, in the case of a mismatch, NFET 609 is deactivated so as to block a control signal along MLx. If all the cells along row-oriented MLx have the corresponding NFET 609 activated, the control signal can pass though the entire word, thus signaling a match. However, if any cell along MLx has NFET 609 deactivated, the control signal will stop from propagating, thus signaling a mismatch.

Similarly, a data match of the data presented on sense lines SLxy_z, SLxy_m results in NFET 611 being activated so as to pass a control signal along column-oriented MLy. Conversely, in the case of a mismatch, NFET 611 is deactivated so as to block a control signal along MLy. If all the cells along column-oriented MLy have the corresponding NFET 611 activated, the control signal can pass though the entire word, thus signaling a match. However, if any cell along MLy has NFET 611 deactivated, the control signal will stop from propagating, thus signaling a mismatch.

The "don't care" state is enabled through a parallel pass gate 612 along the row search path and a parallel pass gate 613 along the column search path. The parallel pass gates 612, 613, are controlled by one of the data nodes (e.g., D1) of SRAM device 606y.

Figure 7:
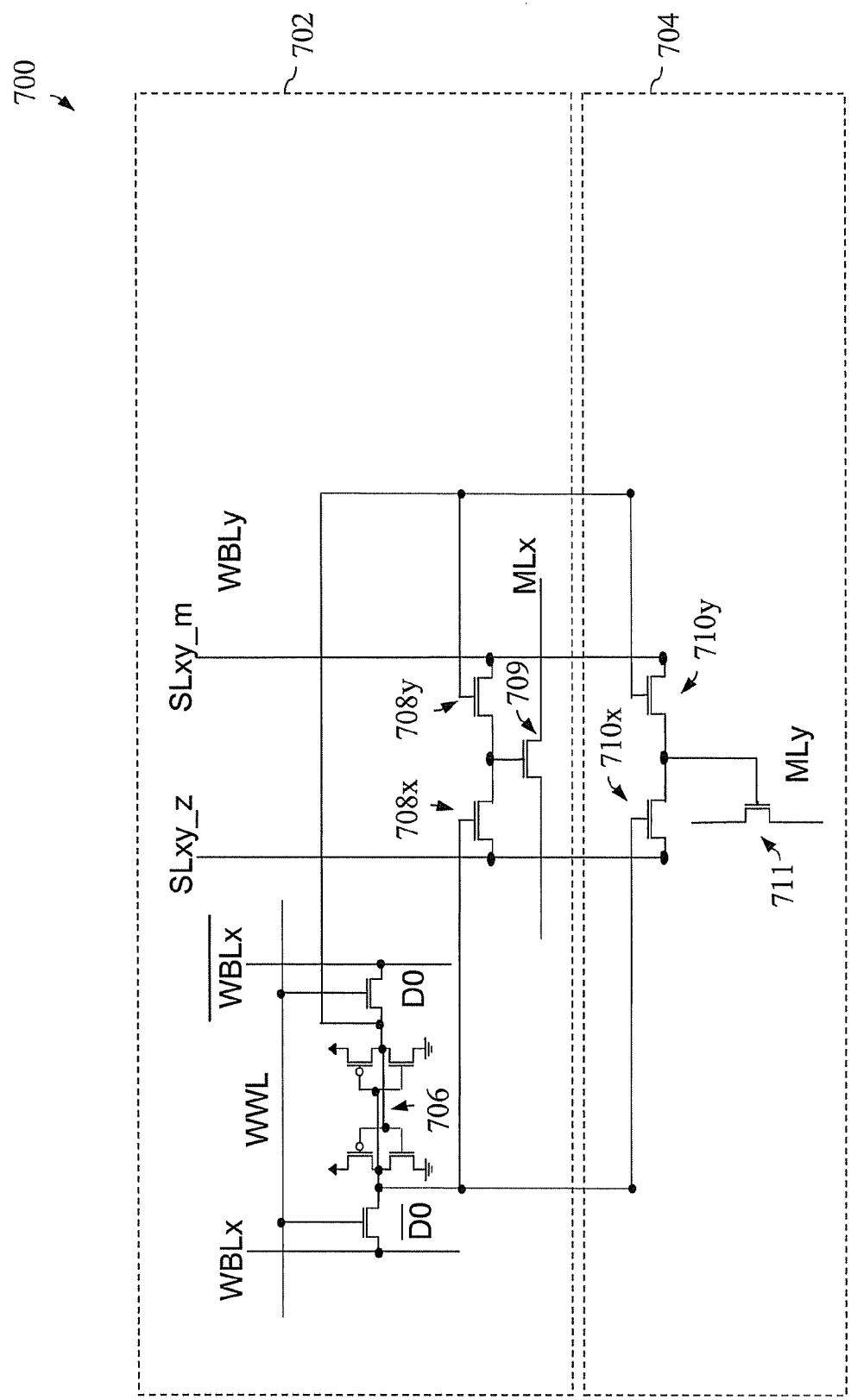
FIG. 7 is a schematic diagram of a 12T, binary version of the NAND-type TCAM in FIG. 6.

As for the case with the NOR-based TCAM cell 400 of FIG. 4, the NAND-based TCAM cell 600 of FIG. 6 can also have a binary form. This is illustrated in FIG. 7. As shown therein, the binary CAM cell 700 with NAND-based compare logic includes a single SRAM storage device 706. In this embodiment, pass gates 708x (row compare) and 710x (column compare) are both coupled to the complement data node D0 bar of the SRAM device 706, while pass gates 708y (row compare) and 710y (column compare) are both coupled to the true data node D0 of the SRAM device 706.

Accordingly, through the use of the above-described CAM cell embodiments, the memory allows the user to simultaneously perform searches along both row and column directions of a memory array, thus effectively resulting in a comparison of a full matrix of search data with another full matrix of stored data. Such capabilities are useful in applications such as for example (but not limited to), image matching, pattern recognition, data compression, read masking with composite words, TCAM table look-up compression, and high-speed matrix reduction.

FIG. 8 is a block diagram illustrating an example of a design flow 800. Design flow 800 may vary depending on the type of IC being designed. For example, a design flow 800 for building an application specific IC (ASIC) will differ from a design flow 800 for designing a standard component. Design structure 810 is preferably an input to a design process 820 and may come from an IP provider, a core developer, or other design company or may be generated by the operator of the design flow, or from other sources. Design structure 810 comprises circuit embodiments 400, 500, 600, 700 in the form of schematics or HDL, a hardware-description language, (e.g., Verilog, VHDL, C, etc.). Design structure 810 may be contained on one or more machine readable medium (s). For example, design structure 810 may be a text file or a graphical representation of circuit embodiments 400, 500, 600, 700 illustrated in FIGS. 4-7. Design process 820 synthesizes (or translates) circuit embodiments 400, 500, 600, 700 into a netlist 830, where netlist 830 is, for example, a list of wires, transistors, logic gates, control circuits, I/O, models, etc., and describes the connections to other elements and circuits in an integrated circuit design and recorded on at least one of a machine readable medium. This may be an iterative process in which netlist 830 is resynthesized one or more times depending on design specifications and parameters for the circuit.

Design process 820 includes using a variety of inputs; for example, inputs from library elements 835 which may house a set of commonly used elements, circuits, and devices, including models, layouts, and symbolic representations, for a given manufacturing technology (e.g., different technology nodes, 32 nm, 45 nm, 90 nm, etc.), design specifications 840, characterization data 850, verification data 860, design rules 870, and test data files 880, which may include test patterns and other testing information. Design process 820 further includes, for example, standard circuit design processes such as timing analysis, verification tools, design rule checkers, place and route tools, etc. One of ordinary skill in the art of integrated circuit design can appreciate the extent of possible electronic design automation tools and applications used in design process 820 without deviating from the scope and spirit of the invention. The design structure of the invention embodiments is not limited to any specific design flow.

Design process 820 preferably translates embodiments of the invention as shown in FIGS. 4-7, along with any additional integrated circuit design or data (if applicable), into a second design structure 890. Second design structure 890 resides on a storage medium in a data format used for the exchange of layout data of integrated circuits (e.g. information stored in a GDSII (GDS2), GL1, OASIS, or any other suitable format for storing such design structures). Second design structure 890 may comprise information such as, for example, test data files, design content files, manufacturing data, layout parameters, wires, levels of metal, vias, shapes, data for routing through the manufacturing line, and any other data required by a semiconductor manufacturer to produce embodiments of the invention as shown in FIGS. 4-7. Second design structure 890 may then proceed to a stage 895 where, for example, second design structure 890: proceeds to tape-out, is released to manufacturing, is released to a mask house, is sent to another design house, is sent back to the customer, etc.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A design structure embodied in a machine readable medium used in a design process, the design structure comprising:
    a content addressable memory (CAM) device, including an array of memory cells arranged in rows in a word line direction and columns arranged in a bit line direction; and
    compare circuitry configured to compare data presented to the array with data stored in each row and column of the array, and simultaneously indicate match results on each row and column of the array, thereby resulting in a two-dimensional, matrix-based data comparison operation, wherein the design structure comprises a netlist describing the CAM device.

2. The design structure of claim 1, further comprising:
    a write word line associated with each row of the array;
    a pair of search lines associated with each cell of the array;
    a row-oriented match line associated with each row of the array; and
    a column-oriented match line associated with each column of the array;
    wherein, for the matrix-based data comparison operation, search results for each individual cell are indicated on both the corresponding row-oriented match line and column-oriented match line associated therewith.

3. The design structure of claim 2, wherein the array of memory cells comprises ternary CAM (TCAM) cells.

4. The design structure of claim 3, wherein each of the TCAM cells further comprises:
    a first SRAM storage device configured to store a first data bit and a second SRAM storage device configured to store a second data bit;
    a first NFET stack associated with the first SRAM storage device and a first of the pair of search lines, and a second NFET stack associated with the second SRAM storage device and a second of the pair of search lines, the first and second NFET stacks comprising the compare circuitry configured to indicate match results on the associated row-oriented match line of the array; and
    a third NFET stack associated with the first SRAM storage device and the first of the pair of search lines, and a fourth NFET stack associated with the second SRAM storage device and the second of the pair of search lines, the third and fourth NFET stacks comprising the compare circuitry configured to indicate match results on the associated column-oriented match line of the array.

5. The design structure of claim 4, wherein the first and third NFET stacks are coupled to the same data node within the first SRAM storage device, and wherein the second and fourth NFET stacks are coupled to the same data node within the second SRAM storage device.

6. The design structure of claim 3, wherein each of the TCAM cells further comprises:
    a first SRAM storage device configured to store a first data bit and a second SRAM storage device configured to store a second data bit;
    a first NFET device associated with a first data node of the first SRAM storage device and a first of the pair of search lines, a second NFET device associated with a second data node of the first SRAM storage device and a second of the pair of search lines, and a third NFET device coupled in series with the associated row-oriented match line of the array, the third NFET device having a gate terminal coupled between the first and second NFET devices, and wherein the first, second and third NFET devices comprise the compare circuitry configured to indicate match results on the associated row-oriented match line of the array;
    a fourth NFET device associated with the first data node of the first SRAM storage device and the first of the pair of search lines, a fifth NFET device associated with the second data node of the first SRAM storage device and the second of the pair of search lines, and a sixth NFET device coupled in series with the associated column-oriented match line of the array, the sixth NFET device having a gate terminal coupled between the fourth and fifth NFET devices, and wherein the fourth, fifth and sixth NFET devices comprise the compare circuitry configured to indicate match results on the associated column-oriented match line of the array; and
    a first parallel pass gate in parallel with the third NFET device, the first parallel pass gate associated with a data node of the second SRAM storage device, and a second parallel pass gate in parallel with the sixth NFET device, the second parallel pass gate also associated with the data node of the second SRAM storage device.

7. The design structure of claim 6, wherein the first and fourth NFET devices are coupled to the same data node within the first SRAM storage device, and wherein the second and fifth NFET devices are both coupled to the opposite data node within the first SRAM storage device, with respect to the first and fourth NFET devices.

8. The design structure of claim 2, wherein each of the CAM cells further comprises:
    an SRAM storage device configured to store a data bit;
    a first NFET stack associated with the SRAM storage device and a first of the pair of search lines, and a second NFET stack associated the SRAM storage device and a second of the pair of search lines, the first and second NFET stacks comprising the compare circuitry configured to indicate match results on the associated row-oriented match line of the array; and
    a third NFET stack associated with the SRAM storage device and first of the pair of search lines, and a fourth NFET stack associated with the SRAM storage device and the second of the pair of search lines, the third and fourth NFET stacks comprising the compare circuitry configured to indicate match results on the associated column-oriented match line of the array.

9. The design structure of claim 8, wherein the first and third NFET stacks are coupled to one data node within the SRAM storage device, and wherein the second and fourth NFET stacks are coupled to a complementary data node within the SRAM storage device.

10. The design structure of claim 2, wherein each of the CAM cells further comprises:
   an SRAM storage device configured to store a data bit;
   a first NFET device associated with the SRAM storage device and a first of the pair of search lines, a second NFET device associated with the SRAM storage device and a second of the pair of search lines, and a third NFET device coupled in series with the associated row-oriented match line of the array, the third NFET device having a gate terminal coupled between the first and second NFET devices, and wherein the first, second and third NFET devices comprise the compare circuitry configured to indicate match results on the associated row-oriented match line of the array; and
   a fourth NFET device associated with the SRAM storage device and the first of the pair of search lines, a fifth NFET device associated with the SRAM storage device and the second of the pair of search lines, and a sixth NFET device coupled in series with the associated column-oriented match line of the array, the sixth NFET device having a gate terminal coupled between the fourth and fifth NFET devices, and wherein the fourth, fifth and sixth NFET devices comprise the compare circuitry configured to indicate match results on the associated column-oriented match line of the array.

11. The design structure of claim 10, wherein the first and fourth NFET devices are coupled to one data node within the SRAM storage device, and wherein the second and fifth NFET devices are coupled to a complementary data node within the SRAM storage device.

12. The design structure of claim 1, wherein the design structure resides on storage medium as a data format used for the exchange of layout data of integrated circuits.

13. The design structure of claim 1, wherein the design structure includes at least one of test data files, characterization data, verification data, programming data, or design specifications.

* * * * *